United States Patent
Kim et al.

(10) Patent No.: US 9,728,234 B1
(45) Date of Patent: Aug. 8, 2017

(54) OPERATING METHOD OF SEMICONDUCTOR MEMORY DEVICE

(71) Applicant: SK hynix Inc., Gyeonggi-do (KR)

(72) Inventors: Do Hyun Kim, Gyeonggi-do (KR);
Beom Ju Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/230,196

(22) Filed: Aug. 5, 2016

(30) Foreign Application Priority Data

Apr. 14, 2016 (KR) .......................... 10-2016-0045604

(51) Int. Cl.
*G11C 7/10* (2006.01)
*G11C 8/06* (2006.01)
*G11C 5/06* (2006.01)

(52) U.S. Cl.
CPC ................. *G11C 7/10* (2013.01); *G11C 8/06* (2013.01); *G11C 5/066* (2013.01)

(58) Field of Classification Search
CPC .......... G11C 11/10; G11C 8/06; G11C 5/066; G11C 11/4063; G11C 11/413
USPC .............. 365/189.17, 189.02, 191, 193, 198, 365/230.02
See application file for complete search history.

(56) References Cited

U.S. PATENT DOCUMENTS

| | | | | |
|---|---|---|---|---|
| 6,999,368 B2* | 2/2006 | Fujimoto | ............. | G11C 11/406 365/191 |
| 7,254,090 B2* | 8/2007 | Hara | .................... | G11C 7/1027 365/191 |
| 7,457,176 B2* | 11/2008 | Dono | .................... | G11C 7/222 365/191 |
| 7,787,310 B2* | 8/2010 | Johnson | ............... | G11C 7/1006 365/189.02 |
| 2013/0094271 A1* | 4/2013 | Schuetz | .................. | G11C 5/06 365/63 |
| 2015/0332744 A1* | 11/2015 | Kim | ......................... | G11C 7/12 365/191 |

FOREIGN PATENT DOCUMENTS

KR          100564598          3/2006

* cited by examiner

*Primary Examiner* — Tan T. Nguyen
(74) *Attorney, Agent, or Firm* — IP & T Group LLP (57) ABSTRACT

A method for operating a semiconductor memory device includes receiving input/output signals including a command, an address and data, through input/output lines; and receiving a first control signal and a second control signal, wherein, regardless of a state of the second control signal, when the first control signal which is enabled is received, the input/output signals received through the input/output lines are recognized as the command.

15 Claims, 7 Drawing Sheets

FIG.10

OPERATING METHOD OF SEMICONDUCTOR MEMORY DEVICE

CROSS-REFERENCES TO RELATED APPLICATION

The present application claims priority under 35 U.S.C. §119(a) to Korean application number 10-2016-0045604, filed on Apr. 14, 2016, which is herein incorporated by reference in its entirety.

BACKGROUND

1. Technical Field

Various embodiments generally relate to an operating method of a semiconductor memory device which receives input/output signals based on control signals.

2. Related Art

Semiconductor memory devices are generally classified into a volatile memory device and a nonvolatile memory device. While the volatile memory device loses stored data when power is cut off, the nonvolatile memory device may retain stored data even when power is cut off.

Volatile memory devices may include a dynamic RAM (DRAM) using capacitors, a static RAM (SRAM) using flip-flops, and so forth, according to structures of memory cells.

Nonvolatile memory devices may include a flash memory device, a ferroelectric RAM (FRAM) using ferroelectric capacitors, a magnetic RAM (MRAM) using a tunneling magneto-resistive (TMR) layer, a phase change memory device using a chalcogenide alloy, a resistive RAM (RE-RAM) using a transition metal oxide, and so forth, according to structures of memory cells.

A semiconductor memory device may operate according to control signals provided from a controller. Control signals for controlling a semiconductor memory device may be predefined differently according to manufacturing of the semiconductor memory devices. The more control signals for controlling a semiconductor memory device, the more external connection terminals for receiving the control signals in the semiconductor memory device. Conversely, the fewer the number of control signals, the fewer the number of the external connection terminals. With a fewer number of control signals, an advantage may be provided in that a layout is simplified, but a disadvantage may be caused in that a control operation is complicated.

SUMMARY

Various embodiments are directed to a semiconductor memory device with a reduced number of external connection terminals for receiving control signals.

In an embodiment, a method for operating a semiconductor memory device may include: receiving input/output signals including a command, an address and data, through input/output lines; and receiving a first control signal and a second control signal, wherein, regardless of a state of the second control signal, when the first control signal which is enabled is received, the input/output signals received through the input/output lines are recognized as the command.

In an embodiment, a method for operating a semiconductor memory device may include: receiving a first control signal and a second control signal; and receiving input/output signals, wherein the input/output signals are recognized as any one of a command, an address and data, according to a combination of the first control signal and the second control signal.

According to the embodiments, the number of external connection terminals of a semiconductor memory device, for receiving control signals, may be decreased.

According to the embodiments, the layout of a printed circuit board on which the semiconductor memory device is mounted may be simplified.

According to the embodiments, the number of external connection terminals of a controller which controls the semiconductor memory device may be decreased.

DETAILED DESCRIPTION

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in detail to the extent that a person skilled in the art to which the invention pertains can easily enforce the technical concept of the present invention.

It is to be understood herein that embodiments of the present invention are not limited to the particulars shown in the drawings and that the drawings are not: necessarily to scale and in some instances proportions may have been exaggerated to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, an operating method for a semiconductor memory device will be described below with reference to the accompanying drawings through various examples of embodiments.

Figure 1:
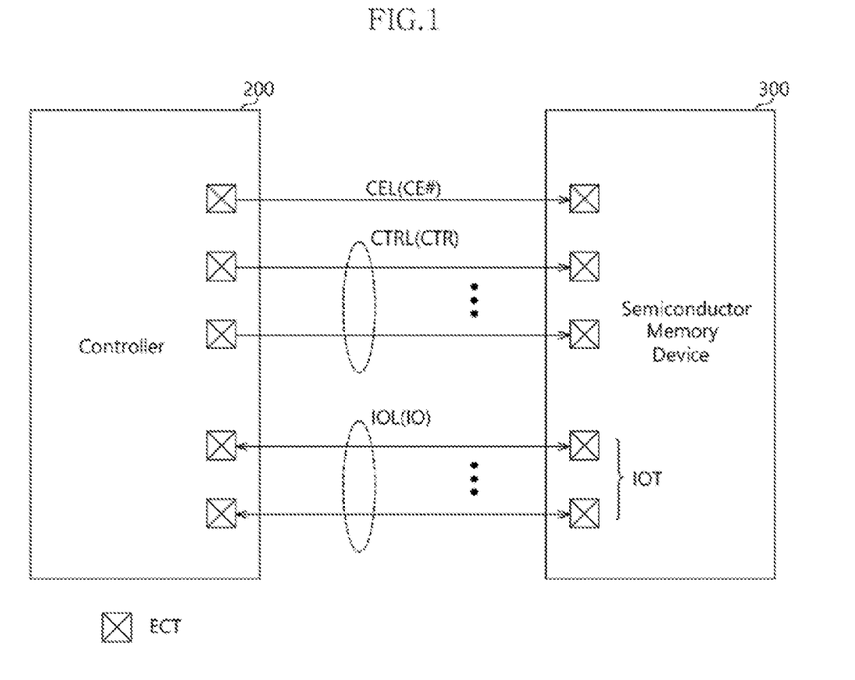
FIG. 1 is a diagram illustrating a connection relationship between a semiconductor memory device and a controller.

FIG. 1 is a diagram illustrating a connection relationship between a semiconductor memory device 300 and a controller 200. For convenience in description, the controller 200 and the semiconductor memory device 300 which transmit and receive a chip enable signal or a chip selection signal CE# control signals CTR and input/output signals IO are illustrated in FIG. 1.

Each of the controller 200 and the semiconductor memory device 300 may include external connection terminals ECT. The external connection terminals ECT may mean physical interfaces for transferring signals such as pads, leads, pins and balls.

The controller 200 and the semiconductor memory device 300 may be connected to each other through signal lines which are connected to the external connection terminals ECT. The controller 200 and the semiconductor memory device 300 may transmit and receive various signals, for example, control signals and data, through the signal lines.

For example, referring to FIG. 1, the controller 200 may transmit the chip enable signal CE# through a chip enable signal line CEL to the semiconductor memory device 300. The controller 200 may transmit the control signals CTR through control signal lines CTRL to the semiconductor memory device 300. Further, the controller 200 may transmit the input/output signals IO to the semiconductor memory device 300 or receive the input/output signals IO from the semiconductor memory device 300, through input/output, lines IOL.

The standpoints of the controller 200 and the semiconductor memory device 300 with respect to control signals may be opposite to each other. That is, the controller 200 may be a subject which transmits control signals to control the semiconductor memory device 300, and the semiconductor memory device 300 may be an object which receives the control signals to be controlled by the controller 200. For convenience, the following descriptions will be made from the standpoint of the semiconductor memory device 300 which receives the control signals.

The semiconductor memory device 300 may use an input/output multiplexing scheme. That is, the semiconductor memory device 300 may be controlled by the controller 200 in the input/output multiplexing scheme. The input/output multiplexing scheme may mean a scheme for transmitting and receiving any one of a command, an address and data as the input/output signals JO through input/output connection terminals JOT or the input/output lines IOL. Furthermore, the input/output multiplexing scheme may mean a scheme for receiving not only data but also a command and an address through the input/output connection terminals IOT or the input/output lines IOL.

For the semiconductor memory device 300 to identify types of input/output signals IO such as, a command, an address or data, which are transmitted through the input/output connection terminals JOT or the input/output lines IOL, the controller 200 may transmit at least one control signal. The semiconductor memory device 300 may identify types of the input/output signals IO such as, a command, an address or data according to the at least one control signal or a combination of the control signals provided from the controller 200.

Figure 2:
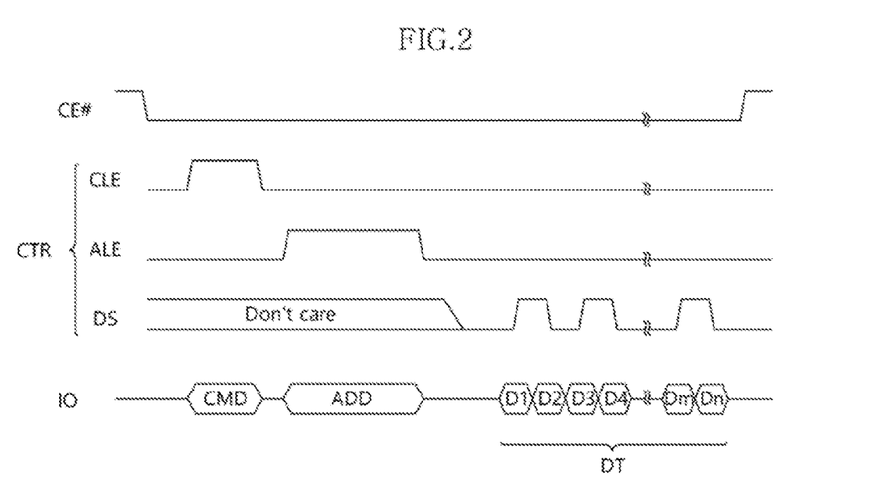
FIG. 2 is a timing diagram to assist in the description of an input/output multiplexing scheme in accordance with an embodiment.
Figure 3:
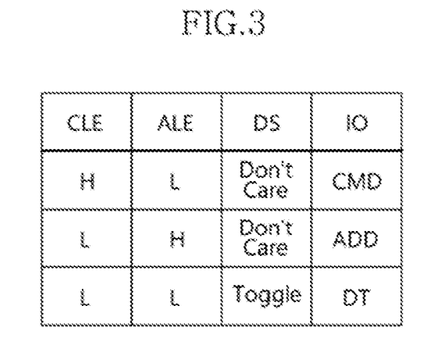
FIG. 3 is a table to assist in the description of control signals used in the input/output multiplexing scheme shown in FIG. 2.

FIG. 2 is timing diagram to assist in the description of an input/output multiplexing scheme in accordance with an embodiment. FIG. 3 is a table to assist in the description of control signals used in the input/output multiplexing scheme shown in FIG. 2.

In a designation of signals, a signal suffixed with a symbol "#" may mean a signal which is enabled when the state of the signal is logic low and is disabled when the state of the signal is logic high. Further, a signal not suffixed with the symbol "#" may mean a signal which is enabled when the state of the signal is logic high and is disabled when the state of the signal is logic low. The enablement of a signal when the state of the signal is logic low or logic high is for illustration purposes only, and may be changed according to a designer's intention.

The semiconductor memory device 300 may be activated and perform an operation according to control of the controller 200 when the state of the chip enable signal CE# is logic low.

The semiconductor memory device 300 may receive, as the control signals CTR a command latch enable signal CLE, an address latch enable signal ALE and a data strobe signal DS. These exemplified control signals CTR are for describing the present embodiment, and the control signals CTR may vary according to the type of the semiconductor memory device 300.

The command latch enable signal CLE may be a first control signal transmitted from the controller 200 to control the semiconductor memory device 300 to identify the input/output signals IO transmitted through the input/output lines IOL as the command CMD. The address latch enable signal ALE may be a second control signal transmitted from the controller 200 to control the semiconductor memory device 300 to identify the input/output signals IO transmitted through the input/output lines IOL as the address ADD. The data strobe signal DS may be a third control signal transmitted from the controller 200 to control the semiconductor memory device 300 to identify the input/output signals IO transmitted through the input/output lines IOL as the data DT.

The semiconductor memory device 300 may identify the provided input/output signals IO as the command CMD when the state of the command latch enable signal CLE is an enabled state that is, a logic high state and the state of the address latch enable signal ALE is a disabled state that is, a logic low state. In this case, the data strobe signal DS may be regarded as a "Don't care" signal.

The semiconductor memory device 300 may identify the provided input/output signals IO as the address ADD when the state of the address latch enable signal ALE is an enabled state that is, a logic high state and the state of the command latch enable signal CLE is a disabled state that is, a logic low state. In this case, the data strobe signal DS may also be regarded as a Don't care signal.

The semiconductor memory device 300 may identify the provided input/output signals IO as the data DT when the states of the command latch enable signal CLE and the address latch enable signal ALE are the disabled states that is, the logic low states and the data strobe signal DS toggles. The semiconductor memory device 300 may receive the data DT one by one through the input/output lines IOL each time the data strobe signal DS toggles when the states of the command latch enable signal CLE and the address latch enable signal ALE are the disabled states that is, the logic low states. Toggling of a signal may mean that the signal transitions from a logic low state to a logic high state and then transitions from the logic high state to the logic low state.

According to the present embodiment, the semiconductor memory device 300 may identify the provided input/output signals IO through the input/output lines IOL as one among the command CMD, the address ADD and the data DT according to the combination of the command latch enable signal CLE, the address latch enable signal ALE and the data strobe signal DS.

Figure 4:
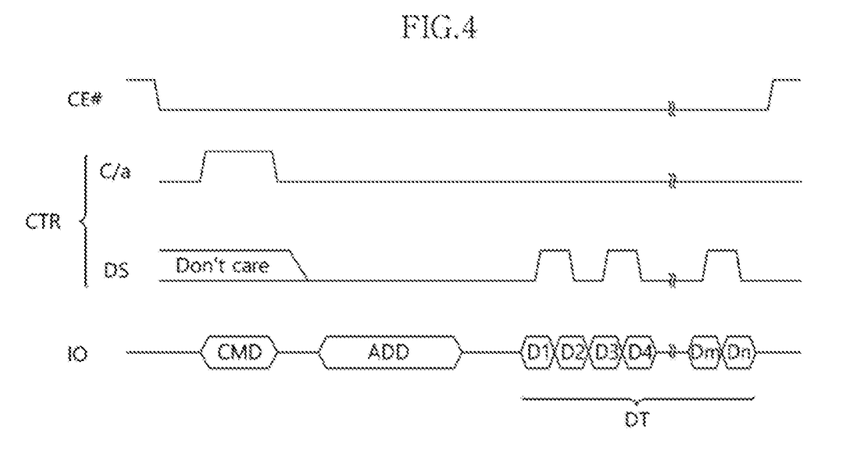
FIG. 4 is a timing diagram to assist in the description of an input/output multiplexing scheme in accordance with another embodiment.
Figure 5:
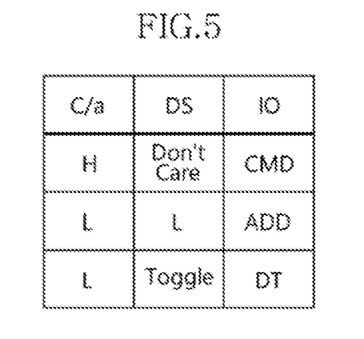
FIG. 5 is a table to assist in the description of control signals' used in the input/output multiplexing scheme shown in FIG. 4.

FIG. 4 is a timing diagram to assist in the description of an input/output multiplexing scheme in accordance with another embodiment. FIG. 5 is a table to assist in the description of control, signals used in the input/output multiplexing scheme shown in FIG. 4.

In a designation of signals, a signal suffixed with a symbol "#" nay mean a signal which is enabled when the state of the signal is logic low and is disabled when the state of the signal is logic high. Further, a signal not suffixed with the symbol "#" may mean a signal which is enabled when the state of the signal is logic high and is disabled when the state of the signal is logic low. The enablement of a signal when the state of the signal is logic low or logic high is for an illustration purpose only, and may be changed according to a designer's intention.

The semiconductor memory device 300 may be activated and perform an operation according to control of the controller 200, when the state of the chip enable signal CE# is logic low.

The semiconductor memory device 300 may receive, as the control signals CTR, a command/address signal C/a and a data strobe signal DS. The command/address signal C/a may be a first control signal transmitted from the controller 200 to control the semiconductor memory device 300 to identify the input/output signals IO transmitted through the input/output lines ICL as a command CMD or an address ADD. The data strobe signal DS may be a second control signal transmitted from the controller 200 to control the semiconductor memory device 300 to identify the input/output signals IO transmitted through the input/output lines IOL as data DT.

The semiconductor memory device 300 may identify the provided input/output signals IO as the command CMD when the state of the command/address signal C/a is an enabled state that is, a logic high state. In this case, the data strobe signal DS may be regarded as a Don't care signal.

The semiconductor memory device 300 may identify the provided input/output signals IO as the address ADD when the states of the command/address signal C/a and the data strobe signal DS are disabled states that is, logic low states.

The semiconductor memory device 300 may identify the provided input/output signals IO as the data DT when the state of the command/address signal C/a is the disabled state that is, the logic low state and the data strobe signal DS toggles. The semiconductor memory device 300 may receive the data DT one by one through the input/output lines IOL each time the states of the command/address signal C/a is the disabled state that is, the logic low state and the data strobe signal DS toggles. Toggling of a signal may mean that the signal transitions from a logic iow state to a logic high state and then transitions from the logic high state to the logic low state.

According to the present embodiment, the semiconductor memory device 300 may recognize that the input/output signals IO received through the input/output lines IOL as one among the command CMD, the address ADD and the data DT, according to the combination of the command/address signal C/a and the data strobe signal DS. Since the input/output multiplexing scheme is used by combining a minimum number of control signals, the number of external connection terminals of the semiconductor memory device 300 for receiving control signals may be decreased, the layout of a printed circuit board for mounting the semiconductor memory device 300 may be simplified, and the number of external connection terminals of the controller 200 for controlling the semiconductor memory device 300 may be decreased.

Figure 6:
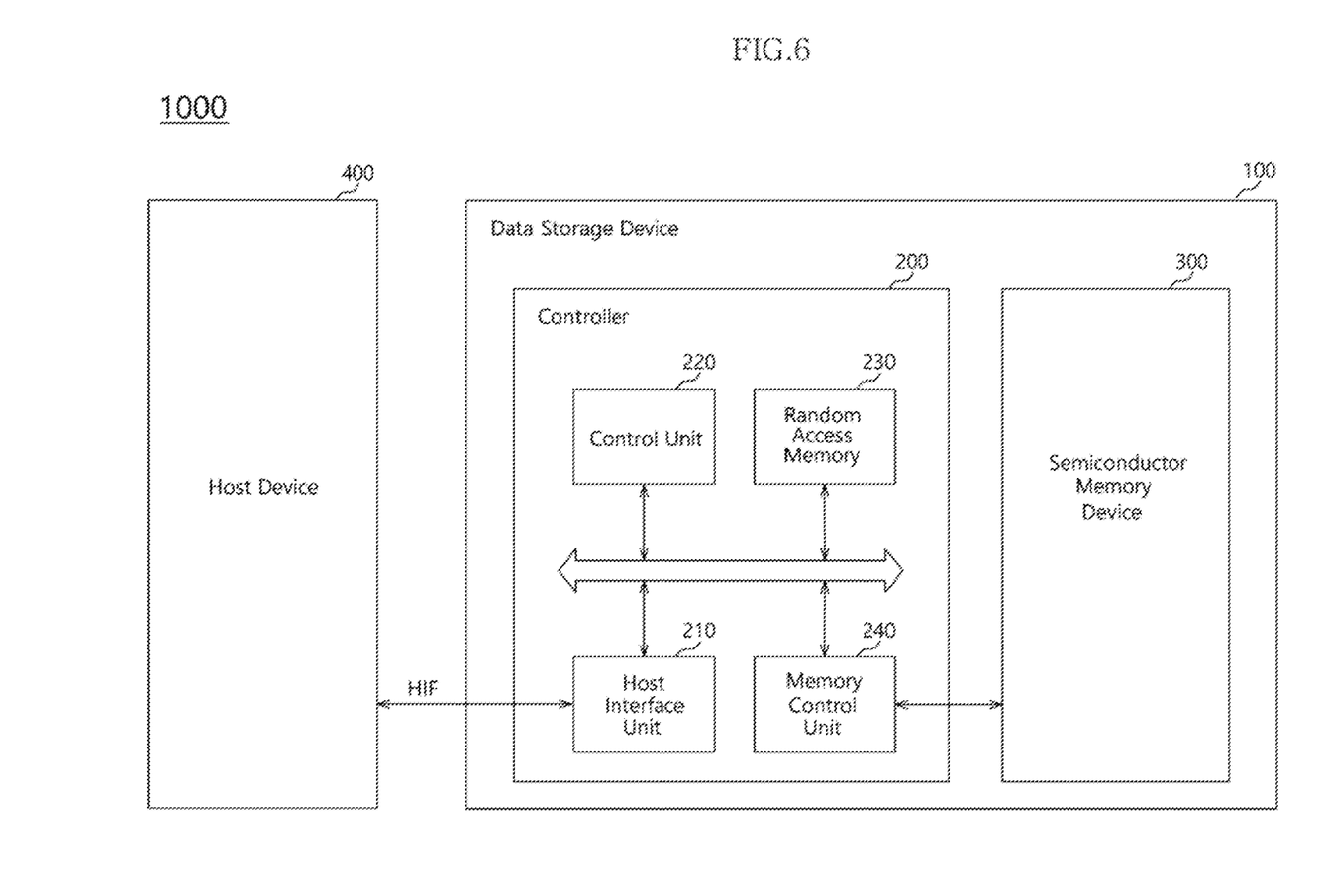
FIG. 6 is a block diagram illustrating a data processing system in accordance with an embodiment.

FIG. 6 is a block diagram illustrating a data processing system in accordance with an embodiment.

A data processing system 1000 may include a host device 400. The host device 400 may include portable electronic devices such as a mobile phone, an MP3 player and a laptop computer and electronic devices such as a desktop computer, a game player, a TV and an in-vehicle infotainment system.

The data processing system 1000 may include a data storage device 100. The data storage device 100 may store data accessed by the host device 400. The data storage device 100 may also be referred to as a memory system.

The data storage device 100 may be manufactured as any one among various types of storage devices according to a host interface HIF which is a transmission protocol with respect to the host device 400. For example, the data storage device 100 may be configured as any one of various types of storage devices such as a solid state drive a multimedia card in the form of an MMC an eMMC, an RS-MMC and a micro-MMC, a secure digital card in the form of an SD, a mini-SD and a micro-SD a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CG) card, a smart media card, a memory stick, and so forth.

The data storage device 100 may be manufactured as any one among a variety of package types. For example, the data storage device 100 may be manufactured as any one of package types such as a package-on-package (POP), a system-in-package (SIP), a system-on-chip (SOC), a multi-chip package (MCP), a chip-on-board (COB), a wafer-level fabricated package (WFP) and a wafer-level stack package (FISP).

The data storage device 100 may include a controller 200. The controller 200 may include a host interface unit 210, a control unit 220, a random access memory 230, and a memory control unit 240.

The host interface unit 210 may interface the host device 400 and the data storage device 100. For example, the host interface unit 210 may communicate with the host device 400 by using any one among standard transmission protocols such as universal serial bus (USB), universal flash storage (UFS), multimedia card (MMC), parallels advanced technology attachment (PATA) serial advanced technology attachment (BATA), small computer system interface (SCSI), serial attached SCSI (SAS), peripheral component interconnection (PCI) and PCI express (PCI-E) protocols.

The control unit 220 may control general operations of the controller 200. The control unit 220 may drive an instruction or an algorithm of a code type, that is, a software, loaded in the random access memory 230, and may control operations of function blocks in the controller 200. The control unit 220 may analyze and process a request of the host device 400 transmitted through the host interface unit 210. The control unit 220 may be configured by a micro control unit (MCU) or a central processing unit (CPU).

The random access memory 230 may store software driven by the control unit 220. The random access memory 230 may store data necessary for driving of the software. That is, the random access memory 230 may operate as the working memory of the control unit 220.

The random access memory 230 may temporarily store data transmitted from the host device 400 to a semiconductor memory device 300 or from the semiconductor memory device 300 to the host device 400. That is, the random access memory 230 may operate as a data buffer memory or a data cache memory.

The memory control unit 240 may control the semiconductor memory device 300 according to control of the control unit 220. The memory control unit 240 may generate control signals for controlling the operation of the semiconductor memory device 300, for example, commands, addresses clock signals and so forth, and provide the generated control signals to the semiconductor memory device 300. The memory control unit 240 may also be referred to as a memory interface unit.

The data storage device 100 may include the semiconductor memory device 300.

The semiconductor memory device 300 may be used as the storage medium of the data storage device 100. The semiconductor memory device 300 may be configured using any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide. The ferroelectric random access memory (FRAM), the magnetic random access memory (MRAM), the phase change random access memory (PCRAM) and the resistive random access memory (RERAM) are a type of nonvolatile random access memory devices capable of random access to memory cells. The semiconductor memory device 300 may be configured using a combination of a NAND flash memory device and the above-described various types of nonvolatile random access memory devices.

As aforementioned above, the semiconductor memory device 300 may recognize that the input/output signals received through input/output lines as one of a command, an address and data, according to a combination of a command/address signal and a data strobe signal.

Figure 7:
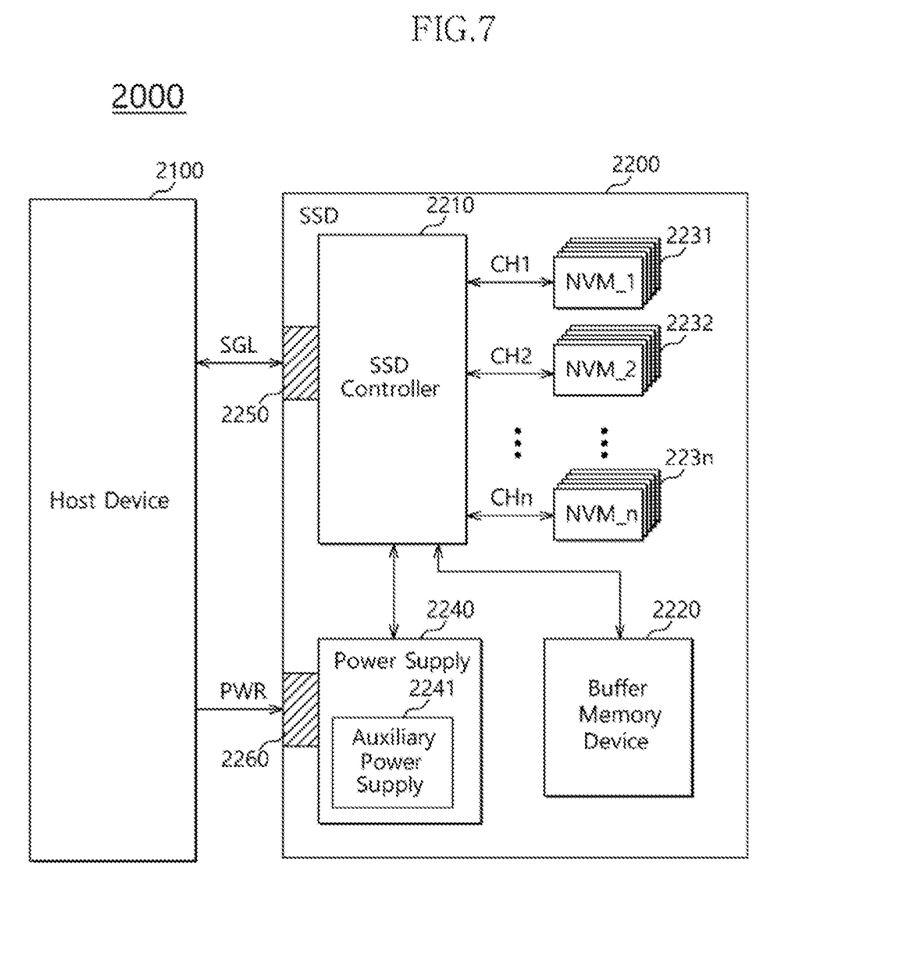
FIG. 7 is a block diagram illustrating a solid state drive (SSD) in accordance with an embodiment.

FIG. 7 is a block diagram illustrating a solid state drive (SSD) in accordance with an embodiment. Referring to FIG. 7, a data processing system 2000 may include a host device 2100 and a solid state drive (SSD) 2200.

The SSD 2200 may include an SSD controller 2210, a buffer memory device 2220, nonvolatile memory devices 2231 to 223n, a power supply 2240, a signal connector 2250, and a power connector 2260.

The SSD 2200 may operate in response to a request of the host device 2100. That is, the SSD controller 2210 may access the nonvolatile memory devices 2231 to 223n in response to a request from the host device 2100. For example, the SSD controller 2210 may control read, program and erase operations of the nonvolatile memory devices 2231 to 223n.

The buffer memory device 2220 may temporarily store data to be stored in the nonvolatile memory devices 2231 to 223n. Further, the buffer memory device 2220 may temporarily store data read out from the nonvolatile memory devices 2231 to 223n. The data temporarily stored in the buffer memory device 2220 may be transmitted to the host device 2100 or the nonvolatile memory devices 2231 to 223n under control of the SSD controller 2210.

The nonvolatile memory devices 2231 to 223n may be used as storage media of the SSD 2200. The nonvolatile memory devices 2231 to 223n may be coupled with the SSD controller 2210 through a plurality of channels CH1 to CHn, respectively. One or more nonvolatile memory devices may be coupled to one channel. The nonvolatile memory devices coupled to each channel may be coupled to the same signal bus and data bus.

Each of the nonvolatile memory devices 2231 to 223n may recognize that the input/output signals received through input/output lines as one of a command, an address and data, according to a combination of a command/address signal and a data strobe signal.

The power supply 2240 may provide power PWR inputted through the power connector 2260, to the inside of the SSD 2200. The power supply 2240 may include an auxiliary power supply 2241. The auxiliary power supply 2241 may be configured to supply power to allow the SW 2200 to normally terminate when a sudden power-off occurs. The auxiliary power supply 2241 may include large capacitance capacitors capable of charging power PWR.

The SSD controller 2210 may exchange a signal SGL with the host device 2100 through the signal connector 2250. The signal SGL may include a command, an address, data, and so forth. The signal connector 2250 may by configured by a connector such as of parallel advanced technology attachment (PATA), serial advanced technology attachment (SATA), small computer system interface (SCSI), serial attached SCSI (SAS), peripheral component interconnection (PCI) PCI express (PCI-E) and universal flash storage (UFS) protocols, according to an interface scheme between the host device 2100 and the SSD 2200.

Figure 8:
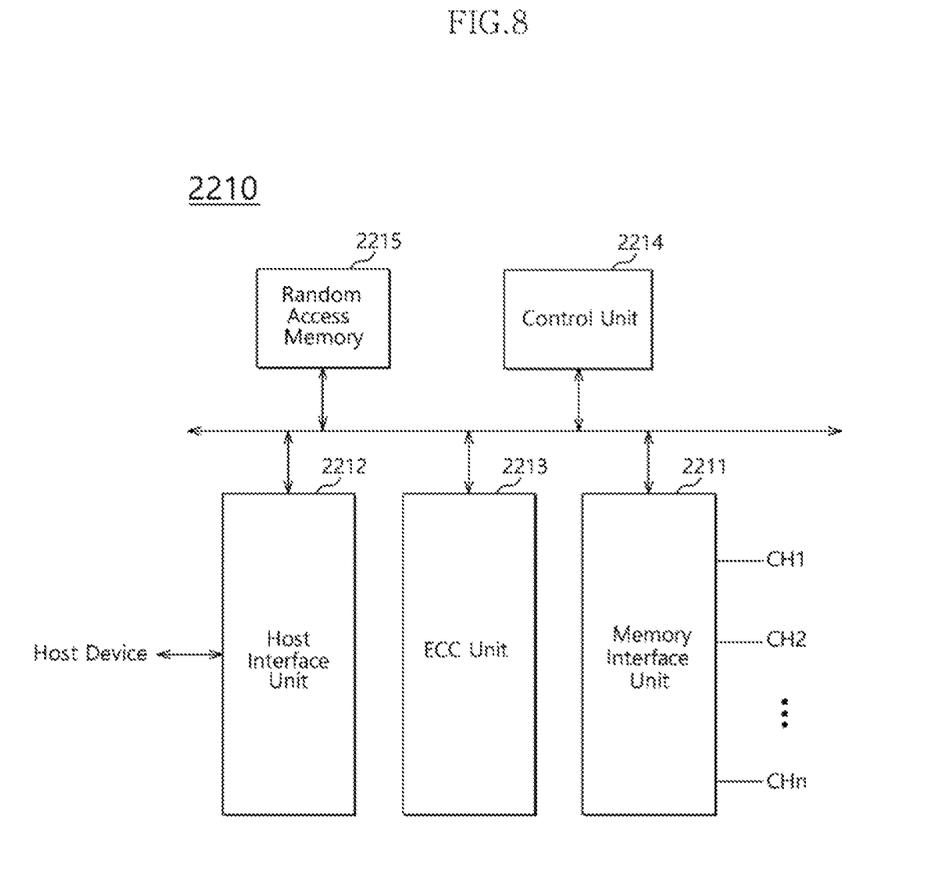
FIG. 8 is a block diagram illustrating the SSD controller shown in FIG. 7.

FIG. 8 is a block diagram illustrating the SSD controller shown in FIG. 7. Referring to FIG. 8, the SSD controller 2210 may include a memory interface unit 2211, a host interface unit 2212, an error correction code (ECC) unit 2213, a control unit 2214, and a random access memory 2215.

The memory interface unit 2211 may provide commands and addresses to the nonvolatile memory devices 2231 to 223n. Moreover, the memory interface unit 2211 may exchange data with the nonvolatile memory devices 2231 to 223n The memory interface unit 2211 may scatter data transmitted from the buffer memory device 2220 to the respective channels CH1 to CHn, under control of the control unit 2214. Furthermore, the memory interface unit 2211 may transmit data read from the nonvolatile memory devices 2231 to 223n to the buffer memory device 2220, under control of the control unit 2214.

The host interface unit 2212 may be configured to interface with the SSD 2200 by using the protocol of the host device 2100. For example, the host interface unit 2212 may communicate with the it host device 2100 through any one of parallel advanced technology attachment (RATA), serial advanced technology attachment (SATA), small computer system interface (SCSI), serial attached SCSI (SAS), peripheral component interconnection (PCI), PCI express (PCI-E) and universal flash storage (UFS) protocols. In addition, the host interface unit 2212 may perform a disk emulating function of supporting the host device 2100 to recognize the SSD 2200 as a hard disk drive (HDD).

The error correction code (ECC) unit 2213 may generate parity data to be transmitted to the nonvolatile memory devices 2231 to 223n, among data stored in the buffer memory device 2220. The generated parity data may be stored, along with data, in the nonvolatile memory devices 2231 to 223n. The error correction code (ECC) unit 2213 may detect an error of the data read from the nonvolatile memory devices 2231 to 223n. When the detected error is within a correctable range, the error correction code (ECC) unit 2213 may correct the detected error.

The control unit 2214 may analyze and process the signal SGL inputted from the host device 2100. The control unit 2214 may control operations of the buffer memory device 2220 and the nonvolatile memory devices 2231 to 223n according to a firmware or a software for driving the SSD 2200. The random access memory 2215 may be used as a working memory for driving the firmware or the software.

Figure 9:
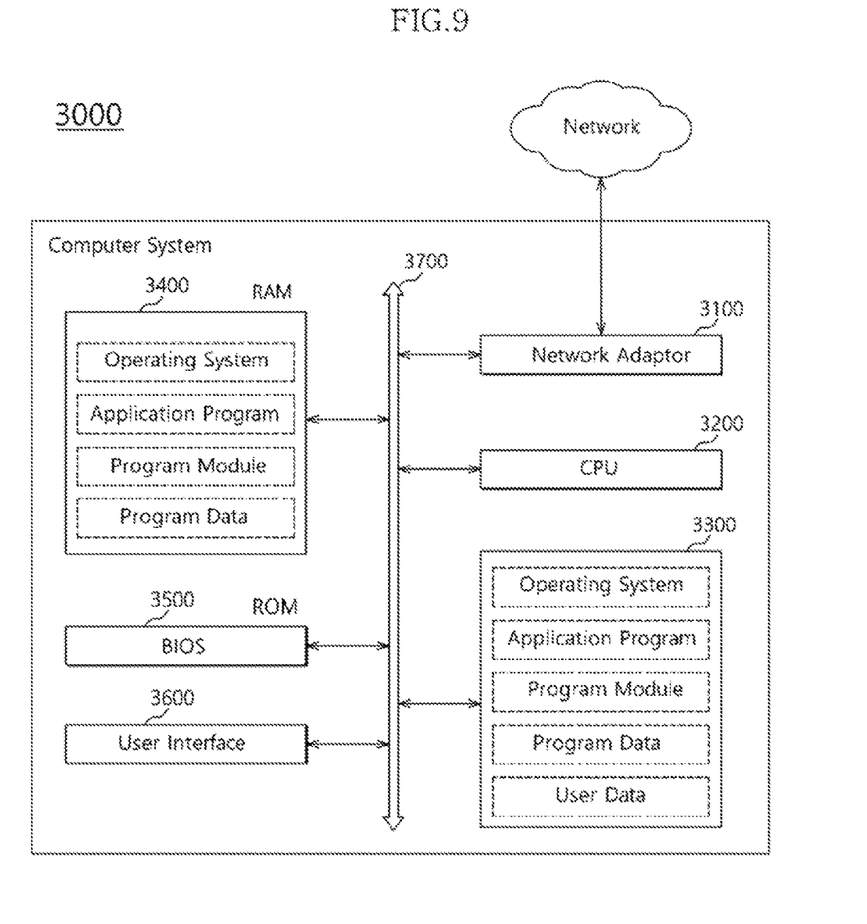
FIG. 9 is a block diagram illustrating a computer system to which the data storage device in accordance with the embodiment is mounted.

FIG. 9 is a block diagram illustrating a computer system in which the data storage device in accordance with the embodiment is mounted. Referring to FIG. 9, a computer system 3000 includes a network adaptor 3100, a central processing unit 3200, a data storage device 3300, a RAM 3400, a ROM 3500 and a user interface 3600, which are electrically coupled to a system bus 3700. The data storage device 3300 may be constructed as the data storage device 1200 shown in FIG. 6 or the SSD 2200 shown in FIG. 7.

The network adaptor 3100 may provide interfacing between the computer system 3000 and external networks. The central processing unit 3200 may perform general calculation processing for driving an operating system residing at the RAM 3400 or an application program.

The data storage device 3300 may store general data required by the computer system 3000. For example, an operating system for driving the computer system 3000, an application program, various program modules, program data and user data may be stored in the data storage device 3300.

The RAM 3400 may be used as the working memory of the computer system 3000. Upon booting, the operating system, the application program, the various program modules and the program data needed for driving programs, which are read from the data storage device 3300, may be loaded in the RAM 3400. A basic input/output system (BIOS) which is activated before the operating system is driven may be stored in the ROM 3500. Information exchange between the computer system 3000 and a user may be implemented through the user interface 3600.

Figure 10:
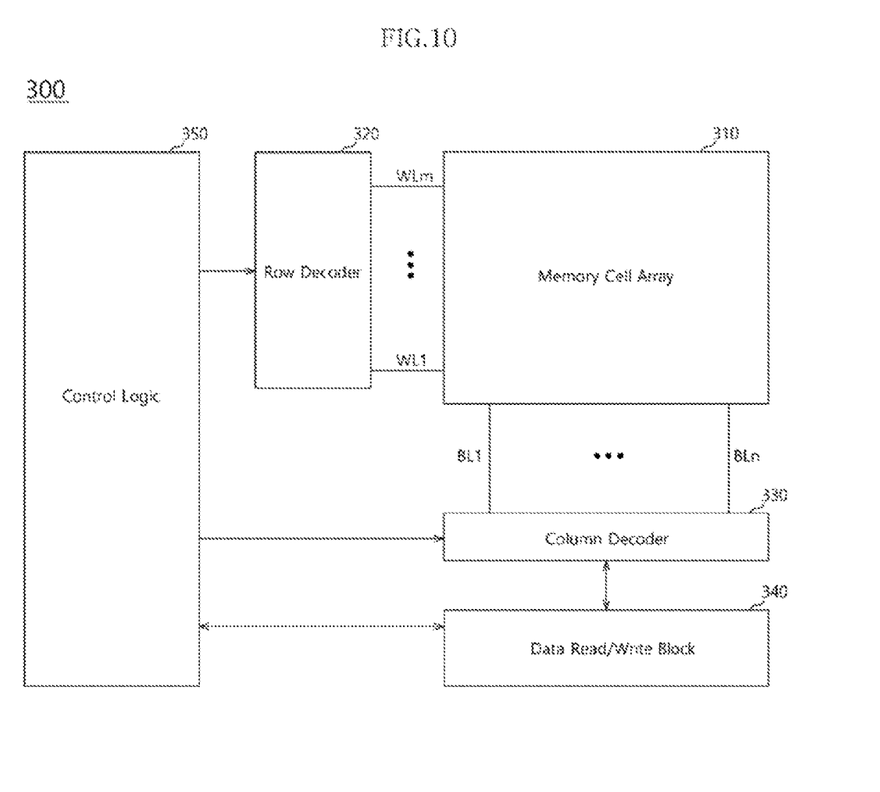
FIG. 10 is a block diagram illustrating a semiconductor memory device included in the data storage device in accordance with the embodiment.

FIG. 10 is a block diagram illustrating a semiconductor memory device included in the data storage device in accordance with the embodiment. Referring to FIG. 10, the semiconductor memory device 300 may include a memory cell array 310, a row decoder 320, a column decoder 330, a data read rite block 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 340 may be coupled with the memory cell array 310 through the bit lines BL1 to BLn. The data read/write block 340 may include read/write circuits RW1 to RWn respectively corresponding to the bit lines BL1 to BLn. The data read/write block 340 may operate according to control of the control logic 360. The data read/write block 340 may operate as a write driver or a sense amplifier according to an operation mode. For example, the data read/write block 340 may operate as a write driver which stores data provided from the external device, in the memory cell array 310 in a write operation. For another example, the data read/write block 340 may operate as a sense amplifier which reads data from the memory cell array 310 in a read operation.

The column decoder 330 may operate according to control of the control logic 360. The column decoder 330 may decode an address provided from the external device. The column decoder 330 may couple the read/write circuits RW1 to RWn of the data read/write block 340 respectively corresponding to the bit lines BL1 to BLn with data input/output lines or data input/output buffers, based on a decoding result.

The voltage generator 350 may generate voltages used in internal operations of the semiconductor memory device 300. The voltages generated by the voltage generator 350 may be applied to the memory cells of the memory cell array 310. For example, a program voltage generated in a program operation may be applied to a word line of memory cells for which the program operation is performed. In another example, an erase voltage generated in an erase operation may be applied to a well area of memory cells for which the erase operation is to be performed. For still another example, a read voltage generated in a read operation may be applied to a word line of memory cells for which the read operation is performed.

The control logic 360 may control general operations of the semiconductor memory device 300, based on control signals provided from the external device. For example, the control logic 360 may control operations of the semiconductor memory device 300 such as read, write and erase operations of the semiconductor memory device 300.

While various embodiments have been described above, it will be understood to those skilled in the art that the embodiments described are examples only. Accordingly, the operating method for a semiconductor memory device described herein should not be limited based on the described embodiments.

What is claimed is:

1. A method for operating a semiconductor memory device, comprising:
   receiving input/output signals including a command, an address and data, through input/output lines; and
   receiving a first control signal and a second control signal,
   wherein when the first control signal is enabled, the input/output signals received through the input/output lines are identified as the command, and
   wherein when the first control signal is disabled and the second control signal is disabled, the input/output signals received through the input/output lines are identified as the address.

2. The method according to claim 1, wherein, when the first control signal is disabled and the second control signal toggles, the input/output signals received through the input/output lines are identified as the data.

3. The method according to claim 2, wherein one data is received through the input/output lines each time the second control signal toggles.

4. The method according to claim 1, wherein the first control signal is transmitted from an external device to allow the input/output signals transmitted through the input/output lines to be identified as the command or the address.

5. The method according to claim 1, wherein the second control signal is transmitted from the external device to allow the input/output signals transmitted through the input/output lines to be identified as the data.

6. The method according to claim 1, wherein, when the first control signal is enabled, the second control signal is regarded as a don't care signal.

7. A method for operating a semiconductor memory device, comprising:
  receiving a first control signal and a second control signal; and
  receiving input/output signals,
  wherein the input/output signals are identified as any one of a command, an address and data, according to a combination of the first control signal and the second control signal,
  wherein when the first control signal is enabled, the input/output signals are identified as the command, and
  wherein when the first control signal is enabled, the second control signal is regarded as a don't care signal.

8. The method according to claim 7, wherein, when the first control signal and the second control signal are disabled, the input/output signals are identified as the address.

9. The method according to claim 7, wherein, when the first control signal is disabled and the second control signal toggles, the input/output signals are identified as the data.

10. A method for operating a semiconductor memory device, comprising:
  receiving input/output signals including a command, an address and data, through input/output lines; and
  receiving a first control signal and a second control signal,
  wherein, regardless of a state of the second control signal, when the first control signal is enabled, the input/output signals received through the input/output lines are identified as the command.

11. The method according to claim 10, wherein when the first control signal is disabled and the second control signal is disabled, the input/output signals received through the input/output lines are identified as the address.

12. The method according to claim 10, wherein when the first control signal is disabled and the second control signal toggles, the input/output signals received through the input/output lines are identified as the data.

13. The method according to claim 12, wherein one data is received through the input/output lines each time the second control signal toggles.

14. The method according to claim 10, wherein the first control signal is transmitted from an external device to allow the input/output signals transmitted through the input/output lines to be identified as the command or the address.

15. The method according to claim 10, wherein the second control signal is transmitted from the external device to allow the input/output signals transmitted through the input/output lines to be identified as the data.

* * * * *